United States Patent [19]

Tuccinardi

[11] 3,995,234

[45] Nov. 30, 1976

[54] RINGING OSCILLATOR INCLUDING A RESONANT CIRCUIT WITH FREQUENCY DIVIDER FEEDBACK LOOP

[75] Inventor: Thomas E. Tuccinardi, Silver Spring, Md.

[73] Assignee: The United States of America as represented by the Secretary of the Army, Washington, D.C.

[22] Filed: Oct. 6, 1975

[21] Appl. No.: 619,713

[52] U.S. Cl. .............................. 331/117 R; 331/166
[51] Int. Cl.² ...................... H03B 3/02; H03B 3/353
[58] Field of Search ............. 331/57, 108 D, 117 R, 331/16 S, 166, 167

[56] References Cited
UNITED STATES PATENTS 3,102,986  9/1963  Harper.................................. 331/57

Primary Examiner—Siegfried H. Grimm
Attorney, Agent, or Firm—Nathan Edelberg; Robert P. Gibson; Saul Elbaum

[57] ABSTRACT

A tuned circuit resonates to produce a ringing signal. The signal is fed to a frequency divider which generates an oscillator output pulse. The pulse is fed back to the tuned circuit for impulse excitation thereof, producing subsequent oscillator output pulses.

9 Claims, 3 Drawing Figures

3,995,234

RINGING OSCILLATOR INCLUDING A RESONANT CIRCUIT WITH FREQUENCY DIVIDER FEEDBACK LOOP

RIGHTS OF THE GOVERNMENT

The invention described herein may be manufactured, used, and licensed by or for the United States Government for governmental purposes without the payment to me of any royalty thereon.

BRIEF DESCRIPTION OF THE PRIOR ART

The prior art has made many attempts to produce an extremely efficient, low power consuming oscillator for various purposes. The well-known Class C Oscillator has traditionally been recognized as the most efficient oscillator design for low power consumption. With this type of an oscillator, the circuitry is usually self biased and peak swings of the bias act as small angle pulse inputs to a normally opened transistor switch. The transistor responds by conducting, which in turn causes the generation of a ringing signal, from a tuned circuit, for one A.C. cycle.

Recent developments in the semiconductor solid state area have made available low power drain devices such as CMOS devices. This type of device has a low input drive requirement. Since the input impedance of this type of device is basically capacitive, all that is required is sufficient power to drive the input capacitance.

Although the briefly discussed prior art approaches have operated generally satisfactorily, there continues a need for oscillator circuitry that consumes less power than the prior art approaches.

BRIEF DESCRIPTION OF THE PRESENT INVENTION

The present invention is directed to a ringing oscillator which is an ultra-low current system based on impulse excitation of a tuned circuit. The impulse is of short duration and is characterized by a current pulse. This is followed by a virtual disconnect so that the tuned circuit is free to ring with a minimum of loading. When sufficient decay of the ringing occurs, the tuned circuit is impulsed again. A unique feature of the present invention is that depending on a particular application, the impulse can occur every cycle or once in many cycles. Thus, the drain on a power supply is minimized.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE PRESENT INVENTION

Figure 1:
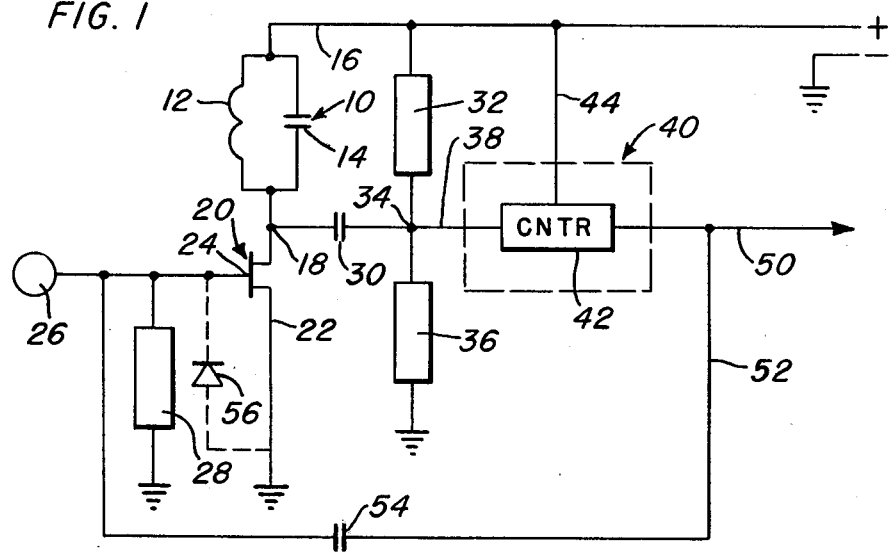
FIG. 1 is a schematic diagram of a first embodiment of the present invention.

Referring to the figures, and more particularly FIG. 1 thereof, a tuned circuit is generally indicated by reference numeral 10. In the illustrated embodiment, the tuned circuit includes the parallel combination of an inductor 12 and a capacitor 14. Although the tuned circuit is shown to be comprised of an inductor and capacitor, other devices may be utilized with similar circuits such as a pendulum, a clock balance wheel system, or even a piezoelectric crystal. The upper terminal of the tuned circuit is connected to a positive potential line 16. The opposite terminal of the tuned circuit is connected, at junction 18, to an N-type enhancement MOSFET 20, at the source terminal thereof. The drain terminal 22 is grounded. The gate terminal 24 of the MOSFET is directly connected to an input terminal 26. This type of oscillator is generally not self-starting and requires a short reset pulse at the input terminal 26 to start oscillation. This pulse momentarily turns the normally opened MOSFET on and produces a current pulse through the tuned circuit 10 causing it to ring. Resistor 28 is connected between the gate terminal 24 of the MOSFET and ground. The resistor 28 biases the MOSFET off. Resistors 32 and 36 are joined at junction 34 while the upper end of resistor 32 is connected to the positive potential 16. The lower end of resistor 36 is grounded. A D.C. blocking capacitor 30 is connected between the source of the MOSFET and the junction point 34. Resistors 32 and 36 bias a CMOS divider, generally indicated by reference numeral 40. The divider includes a CMOS counter 42, which is of conventional design and available in integrated circuit form. The CMOS device of counter 42 is connected at 44 to potential line 16 to provide power to the device. The resistors 32 and 36 are very high valued bias resistors for the counter 42. The value for the resistors is chosen so that the quiescent D.C. level at the input 38 is halfway between the positive potential at 16 and ground. Thus, the swing occurs about the mid-power supply quiescent point. When the tuned circuit rings, the ringing signal is A.C. coupled to the CMOS counter 42. The counter increments its count until the preselected number of cycles occurs, resulting in a square wave form as an output signal at 50. The capacitor 54 is connected, via line 52, between the output line 50 and the input terminal 26. The combination of capacitor 54 and resistor 28 differentiates the output pulse occurring at output line 50 and the positive-going edge pulse again rings the tuned circuit through MOSFET 20. The negative-going edge pulse is shorted by the input protection diode 56 that is inherent to the MOSFET 20.

The following represents several design features of the circuitry just discussed in connection with FIG. 1.

It has been found that the higher the Q of the tuned circuit, the greater the frequency division can be. For example, a Q of 30 will allow division by as large a number as 32.

If stability is the primary need, then the largest value possible for a frequency divisor should be used. This will allow the tuned circuit to ring unloaded for a large percentage of the time. Except during the input impulse to the tuned circuit, the tuned circuit will not be disturbed by the non-linearity or temperature characteristics of any active or passive devices and will be loaded only by the very high resistance of the following bias network.

It is generally true that digital time circuits have long chains of dividers which can serve the needs of the circuit. That being the case, the time base oscillator consists of the MOSFET 20, the differentiator network 28, 54, and the input bias resistors 32, 36, for the divider 40. The power supply drain of this part of the circuit is essentially the average line current through the tuned circuit required to produce the desired average voltage swing in the ring down. The current is inversely proportional to the Q.

If the lowest possible current is desired, then the value for the frequency division is determined otherwise. Given a required average ring down voltage swing, it is evident that the larger the divisor for frequency division, the larger the input turn-on pulse must be to induce the average ring down voltage. As a result, the current required by the oscillator is nearly constant regardless of the divisor. Since dividers in general operate best with rapid transitions through the switching thresholds, the divisor for the frequency divider should be small.

Figure 2:
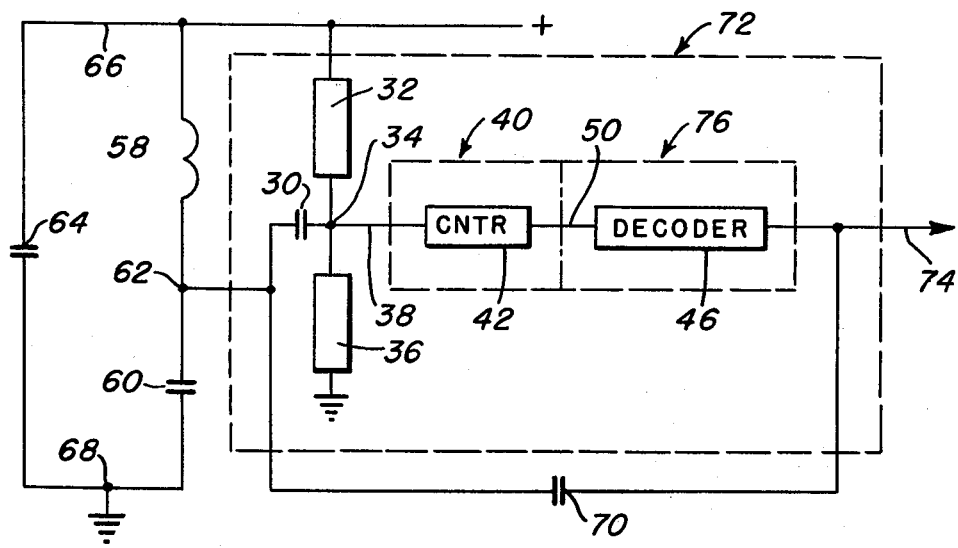
FIG. 2 is a schematic diagram of a second embodiment of the present invention.
Figure 3:
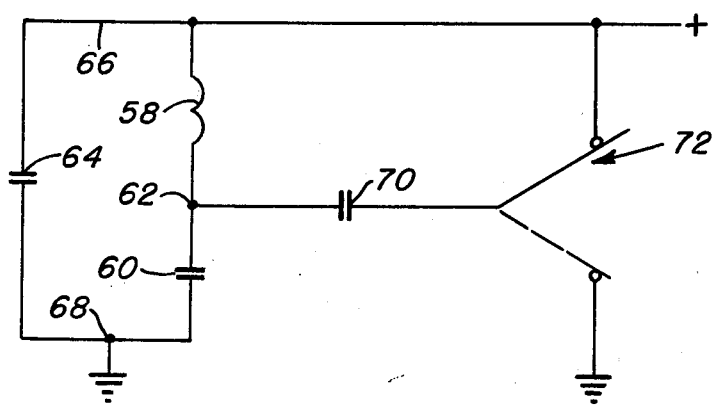
FIG. 3 is an A.C. equivalent circuit of the circuit shown in FIG. 2.

The differentiating circuit, comprising resistor 28 and capacitor 54, as shown in FIG. 1, can be eliminated by decoding the output of the divider 40 to produce a clock pulse for use directly at an input. This works well and has the advantage of eliminating some non-integrable parts. Such a circuit is shown in FIG. 2. In the embodiment shown in FIG. 2, the inductor 58 is connected with the parallel tuned circuit including parallel connected capacitors 60 and 70. A junction point 62 is defined between connected ends of the inductor 58 and capacitor 60. A bypass capacitor 64 is provided at the outward end terminals of the inductor 58 and capacitor 60, these outward terminals being respectively connected to the positive potential line 66 and ground 68 (previously defined in FIG. 1). The D.C. blocking capacitor 30 and bias resistors 32 and 36 are included in the embodiment of FIG. 2 and serve identical functions as the corresponding components, discussed in connection with FIG. 1. A CMOS frequency divider 40, of identical design as previously defined in connection with FIG. 1 is connected between the junction point 34 and the output line 50. A CMOS decoding circuit 46 converts the square wave divider output to a single clock pulse width output at 74. The capacitor 70 is connected in a feedback fashion between the output line 74 and the junction point 62. In order to better appreciate the circuit operation of the embodiment shown in FIG. 2, reference is made to FIG. 3 which shows a corresponding A.C. equivalent circuit without bias components. The A.C. equivalent of the components generally indicated by reference numeral 72, in FIG. 2, is replaced by a switch 72 in FIG. 3.

In the operation of the circuit shown in FIG. 2, the output from the divider is decoded by 46 to give a clock pulse output, to be applied to the tuned circuit. The ratio of capacitor 70 to capacitor 60 is the feedback ratio. The occurrence of the clock pulses is analogous to the switch 72 in FIG. 3 which briefly contacts the positive potential on line 66 and then returns to the ground potential. The switch 72 acts, in the equivalent circuit, as the decoded output of the divider 40. During contact with the positive potential, capacitor 70 is charged and upon contact with the ground potential, the capacitor 70 is discharged. The alternating charging and discharging of the capacitor 70 shocks the tuned circuit into excitation for continuing oscillations. The switch 72 is switched from ground to the positive potential and back to ground in a single half cycle of the tuned circuit frequency. This has been established as being a most efficient means for ringing the tuned circuit.

The ratio of the two capacitors 60 and 70 is designed to limit the amplitude swing across the tuned circuit so that the divider 40 is not overdriven, which would load the tuned circuit and cause a decrease in the Q. Thus, as a design criterion of the circuitry of FIG. 2, the input peak drive to the divider should not exceed the bias voltage.

In a second mode of operation for the circuitry of FIG. 2, the divisor of the divider 40 may be made to be an odd number and the divider output a square wave. In this case, the divider output can be applied directly to capacitor 70 without a decoding circuit.

It should be understood that the invention is not limited to the exact details of construction shown and described herein for obvious modifications will occur to persons skilled in the art.

I claim the following:

1. A ringing oscillator comprising:
    means for resonating at a preselected frequency;
    frequency dividing means connected at its input to the resonating means;
    terminal means defined at the output of the dividing means, for making available thereat, a divider output pulse; and
    feedback means coupling the terminal means to the resonating means for impulsing the resonating means with the pulse thus causing sustained operation of the oscillator.

2. The subject matter of claim 1 together with switching means connected between the resonating means and the dividing means for normally preventing impulsing of the resonating means, thus enabling the resonating means to resonate freely with a minimum of loading.

3. The subject matter of claim 1 wherein the frequency dividing means comprises:
    counting means for incrementally counting in response to a ringing signal from the resonating means;
    decoding means connected to the output of the counting means for generating a signal after a preselected number of cycles has been counted by the counting means.

4. The subject matter set forth in claim 1 wherein the coupling means comprises a capacitor for A.C. coupling the pulse to the resonating means.

5. The subject matter set forth in claim 2 wherein the switching means is a MOSFET device connected in series with the resonating means.

6. The subject matter set forth in claim 3 together with means for supplying biasing power; and
    means for biasing connected between the supplying means and the counting means at a quiescent point midway between positive and negative potentials of the supplying means thereby ensuring an input signal swing to the counting means that is midway between the positive and negative potentials.

7. The subject matter set forth in claim 6 wherein the biasing means connected between the supplying means and the counting means includes resistor means having high resistive values for limiting the loading of a ringing signal at the resonating means.

8. The subject matter set forth in claim 5, together with means for supplying biasing power; and
    means for biasing connected between the supplying means and the counting means at a quiescent point midway between positive and negative potentials of the supplying means thereby ensuring an input signal swing to the counting means that is midway between the positive and negative potentials.

9. The subject matter set forth in claim 8 wherein the biasing means connected between the supplying means and the counting means includes resistor means having high resistive values for limiting the loading of a ringing signal at the resonating means.

* * * * *